United States Patent [19]

Missout et al.

[11] 4,327,335
[45] Apr. 27, 1982

[54] ELECTRONIC LOW-PASS FILTER CIRCUIT WITH AN ADJUSTABLE LONG TIME BASE

[75] Inventors: Gilles Missout, St-Bruno; Francois Lalonde, Varennes; Marius Cloutier, Boucherville, all of Canada

[73] Assignee: Institut de Recherche de l'Hydro-Quebec, Quebec, Canada

[21] Appl. No.: 95,520

[22] Filed: Nov. 19, 1979

[51] Int. Cl.³ .................. H03L 7/08; H04B 15/00
[52] U.S. Cl. ............................ 331/1 A; 328/167; 331/25
[58] Field of Search ............. 331/1 R, 1 A, 17, 18, 331/25; 328/127, 167; 364/825; 307/490

[56] References Cited

U.S. PATENT DOCUMENTS 3,550,018 12/1970 James et al. .................. 328/127 X Primary Examiner—Siegfried H. Grimm
Assistant Examiner—Edward P. Westin
Attorney, Agent, or Firm—Oblon, Fisher, Spivak, McClelland & Maier

[57] ABSTRACT

A filtering circuit having the behavior of a low-pass filter capable of having a long time constant. The filtering circuit comprises an input circuit for receiving a voltage input signal to be filtered. A summator circuit is provided for monitoring the input signal relative to an analog output signal from an accumulator circuit and providing an error signal representative of the difference of the input and output signals. The error signal is fed to a voltage controlled oscillator to generate a frequency signal proportional to the error signal. The accumulator has a frequency dividing circuit is provided to divide the frequency signal by a predetermined division factor to control the low cut-off frequency of the filtering circuit whereby to increase the response time thereof. The accumulator also integrates the divided frequency signal. An output circuit provides an output of the stored integrated frequency signal to constitute the analog output signal.

15 Claims, 4 Drawing Figures

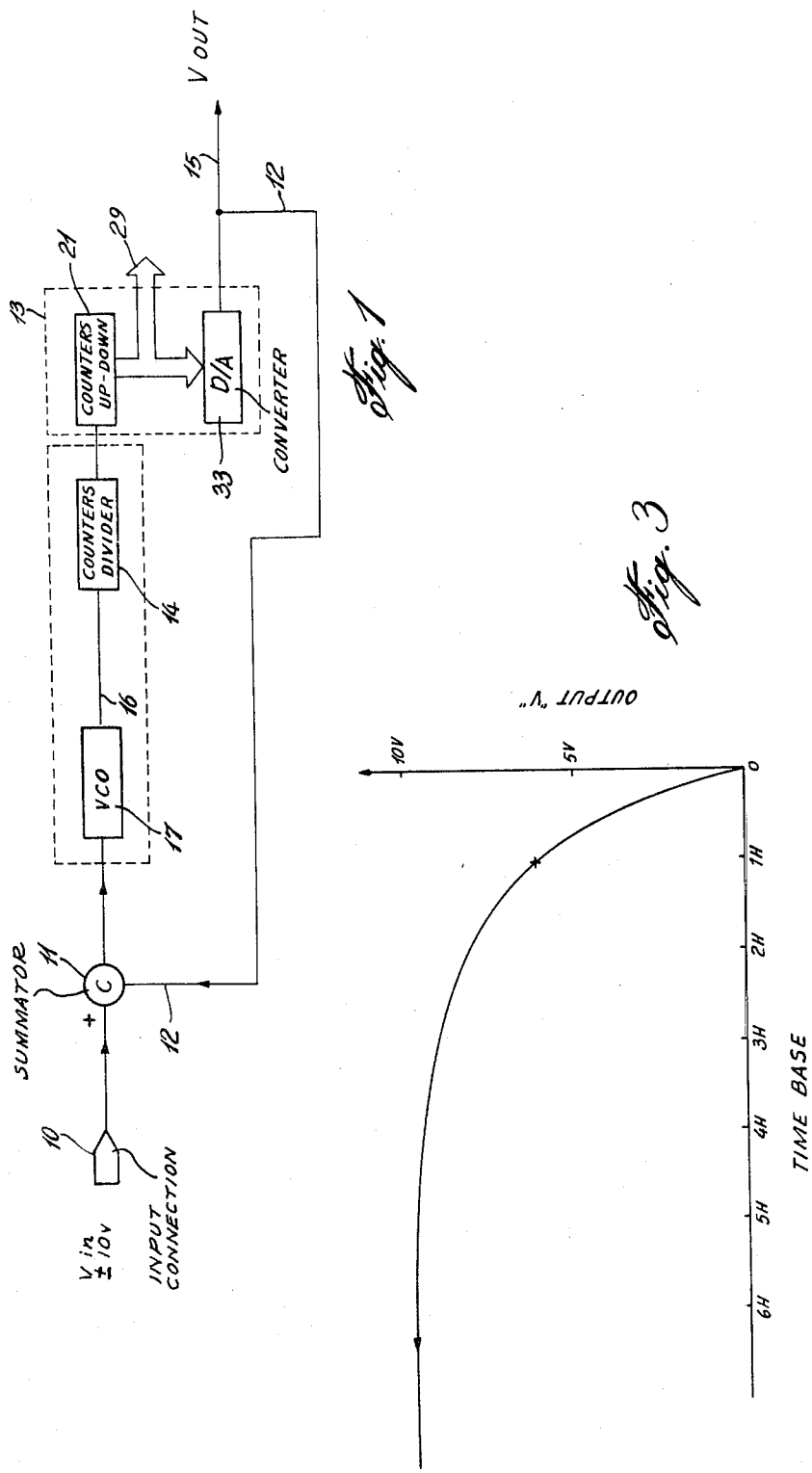

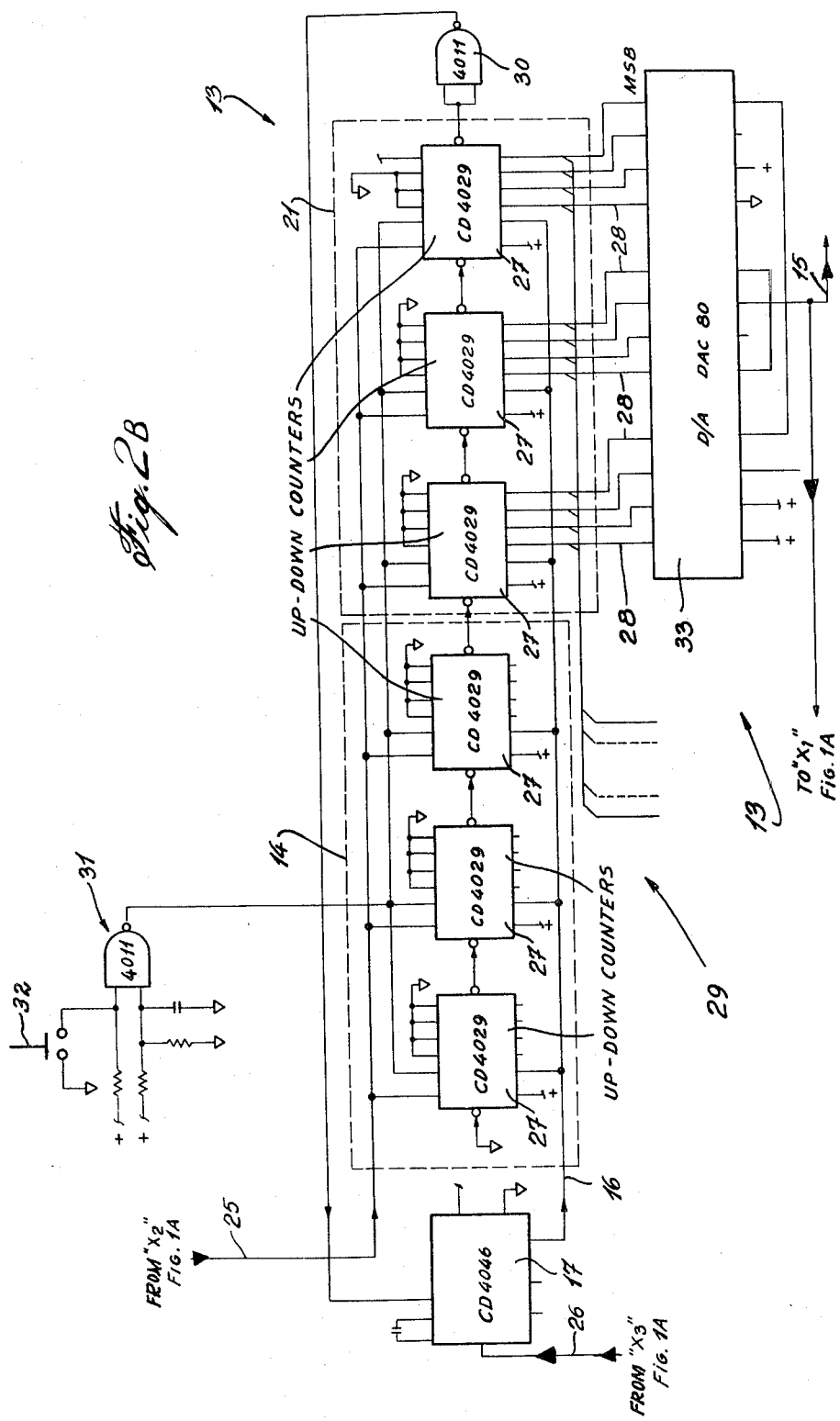

ELECTRONIC LOW-PASS FILTER CIRCUIT WITH AN ADJUSTABLE LONG TIME BASE

BACKGROUND OF INVENTION (a) Field of the Invention

The present invention relates to a filtering circuit having the behaviour of a low-pass R-C filter but capable of having a large time constant.

(b) Description of Prior Art

Various types of circuits are known for sampling or monitoring a signal. For example, averager circuits are known for this purpose, but the disadvantages of these is that they give an average result at the end of each integration period, they are expensive to fabricate, have a very limiting characteristic, they cannot utilize small power supplies as they have a high power consumption and are bulky to package. Also, this type of sampling does not provide an immediate updated output.

When considering an RC filter circuit to solve the low frequency problem of averagers, it also has limitations at such low frequencies and cannot be used to filter with large time constant, that is to say, hours or days. With RC circuits, this is related to the problem of capacitance leakage and also the component parts of an RC filter design are considered large in size when compared to component packages such as those nowadays provided when a circuit is etched on a single chip.

SUMMARY OF INVENTION

It is a feature of the present invention to provide a filtering circuit which substantially overcomes the abovementioned disadvantages.

A further feature of the present invention is to provide a filtering circuit capable of filtering with a large time constant at very low cut-off frequencies.

Another feature of the present invention is to provide a filtering circuit which has a low power consumption, and which may be packaged in a very small area such as on a single chip.

A still further feature of the present invention is to provide a filtering circuit having an adjustable time constant ranging from 1 second to about $10^5$ seconds (27 hours) or more.

A further feature of the present invention is to provide a filtering circuit having an analog or a digital output.

A further feature of the present invention is to provide a filtering circuit having a linear transfer function and wherein an updated output is continually available from the circuit.

A still further feature of the present invention is to provide an improved method of filtering an input signal on a long time base at a low cut-off frequency.

According to the above features, from a broad aspect, the present invention provides a filtering circuit having the behaviour of a low-pass RC filter capable of having a long time constant. The filtering circuit comprises input circuit means for receiving a voltage input signal to be filtered. A summator circuit is provided for monitoring the input signal relative to a feedback analog output signal from an accumulator means and providing an error signal representative of the difference of the input and output signals. The error signal is fed to a voltage controlled oscillator to generate a frequency signal proportional to the error signal. The accumulator means has a frequency dividing circuit is provided to divide the frequency signal by a predetermined division factor to control the low cut-off frequency of the filtering circuit whereby to control the response time of the filtering circuit. The accumulator means also integrates the divided frequency signal. An output circuit means provides an output of the integrated frequency signal to constitute an analog output signal.

According to a further broad aspect of the present invention, there is provided a method of filtering an input voltage signal with a filtering circuit having the behaviour of a low-pass filter capable of having a long time constant. The method comprises the steps of comparing the input signal with a feedback analog output signal in a summator circuit to obtain an error signal representative of the difference of the input signal and feedback output signal. A frequency signal proportional to the error signal is generated in an oscillator circuit. The frequency signal is divided by a predetermined division factor to obtain a desired low cut-off frequency for the filtering circuit and thus a desired time constant. The divided frequency signal is integrated in an accumulator and the integrated signal is converted to an analog signal which is fed back to the accumulator.

According to a still further broad aspect of the present invention, there is provided a filtering circuit having the behaviour of a low-pass RC filter capable of having a long time constant. The filtering circuit comprises a summator to receive an input voltage signal and subtract a feedback analog output voltage signal therefrom to feed an error signal to a voltage controlled oscillator which provides a frequency signal simulating the current flowing in the resistor of an RC filter. An accumulator is provided and capable of being charged and discharged with said frequency signed to simulate the capacitance of an RC filter. A digital to analog converter converts the digital value in the accumulator to an analog output signal which also constitutes the said feedback analog output voltage signal.

BRIEF DESCRIPTION OF DRAWINGS

A preferred embodiment of the present invention will now be described with reference to the example thereof as illustrated by the accompanying drawings in which:

FIG. 1 is a block diagram of the filtering circuit of the present invention;

FIGS. 2A and 2B are schematic diagrams showing the component parts of FIG. 1; and FIG. 3 is an output characteristic curve showing the behaviour of the sampling circuit.

DESCRIPTION OF PREFERRED EMBODIMENTS

Figure 2A:
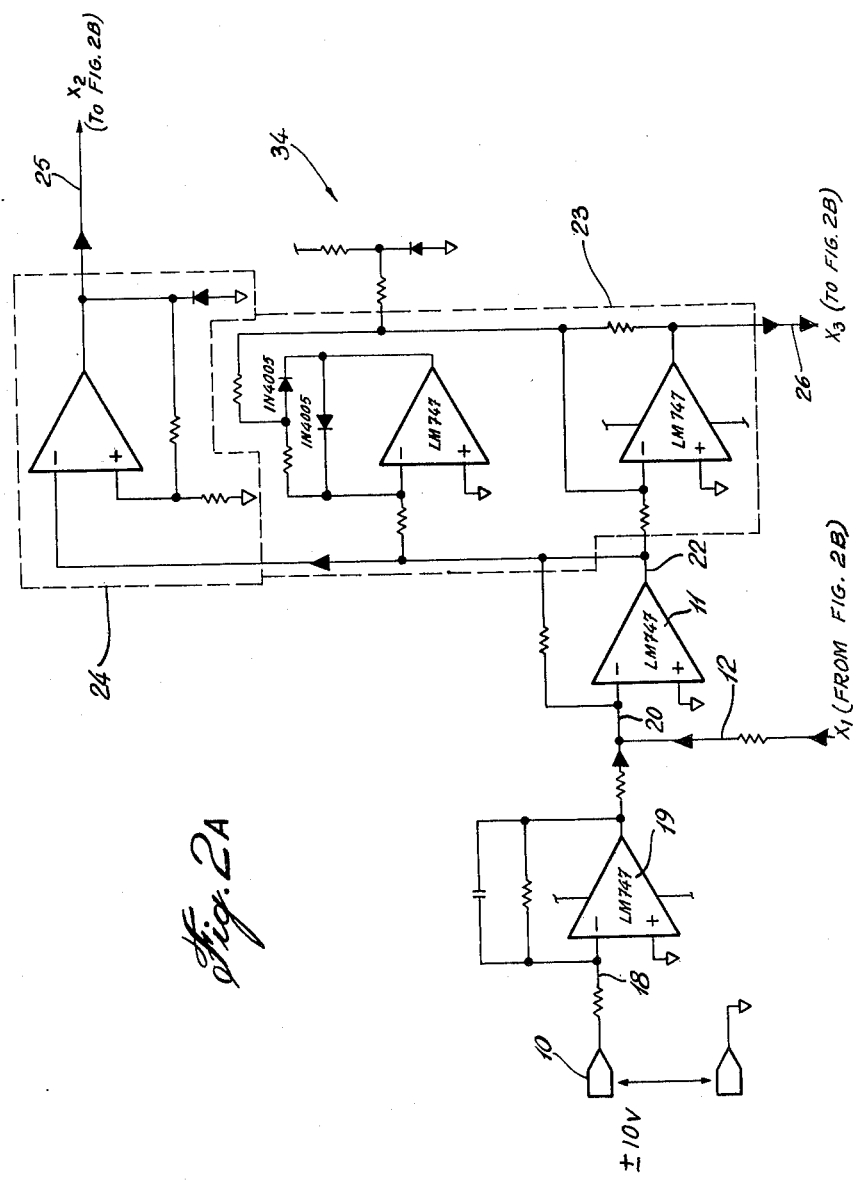

Referring now to the drawings, and more particularly to FIG. 1, there is shown a block diagram illustration of the construction of the filtering circuit of the present invention. This construction was conceived to simulate substantially the behaviour of an RC circuit. As shown a ±10 volt signal is applied to the input connection 10 and fed to the input of a summator circuit 11. A feedback connection 12 provides the analog output voltage signal to the summator 11 which is necessary to realize an RC function, that is to say, the summator 11 followed by a voltage controlled oscillator 17 and a divider circuit 14 give a frequency which will simulate the current of an RC circuit. The current in an RC circuit is proportional to the input voltage minus the output voltage.

The accumulator circuit 13 is provided with an up-down counter circuit 21 which sum the impulses received from the divider circuit 14, thus simulating the capacitor of an RC circuit. In an RC circuit, the capacitor has a voltage which is expressed by $$v = \int \frac{idt}{c}.$$

The divider circuit 14 comprises a predetermined number of counters depending on the filtering circuit time constant required. Thus, divider circuit 14 divides a frequency signal from the voltage controlled oscillator circuit 17, fed by the summator circuit 11, to adjust the time constant of the filtering circuit. A digital to analog converter 33 is provided at the output of the accumulator 13 to provide the analog output voltage feedback signal on feedback line 12 and also to provide the output connection 15 of the filtering circuit. Thus, it can be seen that in the present filtering circuit, we have replaced the current, flowing in the resistor of a standard RC circuit, by a variable frequency signal. The capacitor is replaced by an up/down counter provided in the accumulator circuit and which will be described with reference to FIG. 2. As the counter counts upwards, it simulates a positive frequency and when it counts downwards, it simulates a negative frequency. A polarity detector, as will be described later, provides the address signals to the counters to count up or down.

The differential d/dt of the analog output signal at the connection 15 or on the feedback line 12 is proportional to the input frequency signal at the output 16 of the voltage control oscillator 17 and it can be mathematically expressed as follows:

$$dV_{out}/dt \simeq k_o F_{in} = k_o(F/N)$$

where $V_{out}$ is the output voltage, $k_o$ is the gain of the D/A converter, $F_{in}$ the frequency at the input of the accumulator, F is the frequency at the output of the VCO, and N is the division factor of the frequency dividing circuit;

if $\pm V_{max}$ is the maximum output voltage of the D/A converter and if M is the division factor of the accumulator, then $$\frac{dV_{out}}{dt} \simeq \frac{V_{max}}{M/2} \times \frac{F}{N}$$

on the other hand $$F = k_i \epsilon = k_i(V_{in} - V_{out})$$

where $k_i$ is the gain of the VCO (including the gain of the summator) then $$\frac{dV_{out}}{dt} \simeq \frac{2 V_{max}}{M} \times \frac{k_i(V_{in} - V_{out})}{N}.$$

An RC filter has a comparable behaviour which may be mathematically expressed as follows:

$$dV_{out}/dt = (V_{in} - V_{out})/RC$$

where R is the resistance and C the capacitance, thus the behaviour:

$$\delta = RC = \frac{MN}{2V_{max}k_i}$$

the time constant is proportional to N and M and it is thus possible to increase N at will or $k_i$ can be changed.

Referring now to FIGS. 2A and 2B, there is shown a schematic diagram of the blocks of FIG. 1. As previously described, an input signal in the range of ±10 volts is provided on the input 10 and it represents the signal being filtered. This signal is fed to the input 18 of an input amplifier 19 which has a gain of 1. The amplifier 19 is provided to filter unwanted high frequencies which are above the maximum frequency of the voltage controlled oscillator 17. The output signal of the amplifier 19 is connected to the input 20 of a summator amplifier 11 together with the analog output voltage signal on the feedback line 12. The summator amplifier 11 compares both these signals and provides an output error signal representative of the difference of the input and output voltage signals.

The output 22 of the summator 11 is connected to a full-wave rectifier circuit 23. The rectifier circuit 23 generates an error signal which is proportional to the absolute value of the difference of the input signal and the feedback output signal on line 12. The output 22 is also connected to a polarity detector circuit 24 which has an output connection 25 connected to the divider circuit 14 and the up/down counter circuits 21 to address them as to whether they should count up or down, depending as to whether the output 22 is positive or negative.

The output from the summator, connects to the input 26 of the voltage controlled oscillator 17 through the rectifier circuit 23. The error signal on input 26 will cause the oscillator to generate, on its output 16, a frequency signal proportional to the input error signal. This frequency signal appears on output 16 and is fed to the frequency dividing circuit 14 which comprises a plurality of up/down counters 27 which divide the output frequency of the voltage controlled oscillator. The more counters that are added to the divider circuit 14, the more the frequency signal is divided and the longer is the time constant or the lower is the cut-off frequency.

The accumulator 13 is also provided with a plurality of up/down counters 27 and it accumulates in its memory the digital value of the output voltage. The outputs 28 of the up/down counter circuit 21 are connected to the digital to analog converter 33 and it provides the feedback analog voltage signal. It also provides an output connection 15 to make use of the filtering circuit analog output. The analog output signal on connection 15 or on the feedback line 12 is the one digitally memorized in the up/down counter 21. If for certain use it is required to obtain a digital output signal, then this is obtained from the output connections 29 which connect to the counters 27 in the counter circuit 21.

A gate circuit 30 is connected to the output of the up/down counter circuit 21 and it prevents the counter 21 to jump to 0 when it reaches a maximum, when counting up, and also prevents the counter to jump to its maximum when it reaches 0 on a down count. For example, if the input voltage signal went up to +11 volts or −11 volts, the counter would go up to the maximum giving +10 volts or −10 volts at the output and stop there. If the gate 30 was not provided, the counter would go back to 0 and start counting up again. Thus, such a malfunction is prevented.

A reset gate circuit 31 is also provided and connects to the dividing circuit 14 and the counter circuit 21 to reset the counters 27 therein to a digital value which gives a 0 volt output. This reset function is provided in an automatic or manual mode. Thus, there is provided a manual switch 32 or an automatic power on reset circuit 31, for this purpose. This reset circuit 31 is necessary as the time constant may be one hour and that is how long it would take for the circuit to discharge itself.

An offset compensation circuit 34 consisting of two resistances and a diode is provided to compensate for non-linearity errors in the voltage control oscillator 17 at low voltages in the proximity of 0 volts.

Referring now to FIG. 3, there is shown a typical output characteristic curve illustrating the behaviour of the circuit measured over a 6 hour period. The time constant of the filtering circuit herein measured was approximately 1 hour. It can be seen that this circuit permits very low sampling rate such as to determine the operation of an apparatus over a time scale of, for example, 2 to 3 months. With this type of circuit, one neglects sudden type errors or variations and is more concerned with long term variations. Following the Shannon theorem, the cut-off frequency of the input filter of a sampling system should be lower than half the sampling rate.

A typical example of the use of this circuit is in meteorology where samples of the temperature may be taken every hour. Also, the circuit may measure wind velocity over long periods of time to disregard abrupt changes that take place to offset the average velocity. The output signal is not affected by sudden changes which could affect the result by giving a false reading.

It is within the ambit of the present invention to provide any obvious modifications of the example of the preferred circuit described herein, provided such modifications fall within the scope of the appended claims.

We claim:

1. A filtering circuit having the behaviour of a low-pass filter capable of having a long time constant, said filtering circuit comprising input circuit means for receiving a voltage input signal to be filtered, a summator circuit for monitoring said input signal relative to a feedback analog output signal from an accumulator means and providing an error signal representative of the difference of said input and output signals of the filtering circuit, said error signal being fed to a voltage controlled oscillator to generate a frequency signal proportional to said error signal, a compensation offset network connected to an input of said oscillator to compensate for non-linearity errors in said oscillator at low voltages in the proximity of 0 volts, said accumulator means having a frequency dividing circuit to divide said frequency signal by a predetermined division factor to control the low cut-off frequency of the filtering circuit whereby to control the response time of the filtering circuit, said accumulator means also integrating said divided frequency signal, and output circuit means to provide an output of said integrated frequency signal to constitute said analog output signal.

2. A filtering circuit as claimed in claim 1 wherein said output circuit means is a digital to analog converter having a feedback connection to said summator and an output connection to provide said analog output signal.

3. A filtering circuit as claimed in claim 1 wherein said accumulator means includes an up/down counter circuit having a memory to integrate a frequency signal from said frequency dividing circuit means.

4. A filtering circuit as claimed in claim 1 wherein said input circuit means comprises an amplifier having a gain of 1 and capable of filtering unwanted high frequencies of the voltage input signal, said amplifier having an output connected to an input of said summator circuit, said feedback analog output signal also being connected to said input.

5. A filtering circuit as claimed in claim 1 wherein said accumulator means comprises an up/down counter, said summator circuit being constituted by an amplifier connected at its output to a full-wave rectifier circuit and a polarity detector circuit, said polarity detector circuit senses the polarity of the output signal of the summator amplifier and generates a control signal to an up/down counter circuit in said accumulator means to condition said counter circuit to count up or down depending on the polarity of said summator amplifier output signal whereby to simulate positive or negative frequencies.

6. A filtering circuit as claimed in claim 1 wherein said time constant is adjustable by said divider circuit means in the range of from 1 second to at least $10^5$ seconds by adjusting the maximum frequency of the voltage controlled oscillator.

7. A filtering circuit as claimed in claim 1 wherein said frequency dividing circuit means comprises counter circuits having a division factor proportional to a desired time constant.

8. A filtering circuit as claimed in claim 1 wherein said accumulator means comprises an up/down counter and a D/A converter connected to said up/down counters to provide said analog output signal, said analog output signal has a differential which is proportional to said frequency signal and which is mathematically expressed by:

$$dV_{out}/dt \simeq k_o F_{in} = k_o(F/N)$$

where $V_{out}$ is the output voltage, $k_o$ the gain of said D/A converter, $F_{in}$ is the frequency at the input of the accumulator means, F is the frequency at the output of the VCO, and N is the division factor of the frequency dividing circuit;

if $\pm V_{max}$ is the maximum output voltage of the D/A counter and if M is the division factor of the accumulator means, then, $$\frac{dV_{out}}{dt} \simeq \frac{V_{max}}{M/2} \times \frac{F}{N}$$

on the other hand $$F = k_i \epsilon = k_i(V_{in} - V_{out})$$

where $K_i$ is the gain of the VCO (including the comparator gain), $\epsilon$ is the error signal, and $V_{in}$ is the input signal voltage, then $$\frac{dV_{out}}{dt} \simeq \frac{2 V_{max}}{M} \times \frac{k_i(V_{in} - V_{out})}{N}.$$

9. A filtering circuit as claimed in claim 8 wherein said filtering circuit acts like an RC filter circuit having a comparable behaviour which may be mathematically expressed as follows; wherein in an RC circuit $$dV_{out}/dt = (V_{in} - V_{out})/RC$$

where R is the resistance and C the capacitance, thus the behaviour $$\delta = RC = \frac{MN}{2V_{max}k_i}$$

wherein the time constant $\delta$ is proportional to N and M and it is possible to increase N at will or change $k_i$ or M.

10. A filtering circuit as claimed in claim 3 wherein an upper and lower limit gate circuit is connected to an output of said up/down counter circuit to prevent the counter to pump to 0 when it reaches a maximum value and to jump to maximum value when it reaches 0.

11. A filtering circuit as claimed in claim 3 wherein a reset gate circuit is connected to counters associated with said frequency dividing circuit means and said up/down counters to automatically or manually instantaneously discharge said counters to reset them to a digital value which give a 0 volt signal at the output.

12. A method of filtering an input voltage signal with a filtering circuit having the behaviour of a low-pass filter capable of having a long time constant, comprising the steps of:

(i) comparing said input signal with a feedback analog output signal in a summator circuit to obtain an error signal representative of the difference of said input and feedback output signals, (ii) generating, by means of a voltage controlled oscillator, a frequency signal proportional to said error signal; a compensation offset network connected to an input of said oscillator to compensate for non-linearity errors in said oscillator at low voltages in proximity of 0 volts, (iii) dividing said frequency signal by a predetermined division factor to obtain a desired low cut-off frequency for the filtering circuit and thus a desired time constant for the filtering circuit, (iv) integrating said divided frequency signal in an accumulator, (v) converting the digital integrated signal of said accumulator in a digital to analog converter to provide an analog output signal at an output connection, and (vi) feeding back said analog output signal on a feedback connection to provide said feedback analog output signal to said summator circuit.

13. A method as claimed in claim 12 wherein there is provided the step of adjusting the maximum frequency of the voltage controlled oscillator to obtain a desired time constant for the filtering circuit.

14. A method as claimed in claim 12 wherein said desired low cut-off frequency is controlled by controlling said division factor to obtain a desired time constant for said filtering circuit.

15. A method as claimed in claim 12 wherein said accumulator comprises an up/down counter, and wherein said step (ii) includes generating a control signal by means of a polarity detector to up/down counters of said accumulator to simulate negative frequencies when said error signal has negative values.

* * * * *